United States Patent [19]

Hewig

[11] Patent Number: 4,544,797
[45] Date of Patent: Oct. 1, 1985

[54] METHOD FOR PREVENTING SHORT-CIRCUITS OR SHUNTS IN A LARGE AREA THIN FILM SOLAR CELL AND CELL OBTAINED THEREBY

[75] Inventor: Gert Hewig, Alzenau, Fed. Rep. of Germany

[73] Assignee: NUKEM GmbH, Fed. Rep. of Germany

[21] Appl. No.: 593,296

[22] Filed: Mar. 26, 1984

[30] Foreign Application Priority Data

Apr. 2, 1983 [DE] Fed. Rep. of Germany ....... 3312053

[51] Int. Cl.$^4$ ..................... H01L 31/06; H01L 31/18
[52] U.S. Cl. .................... 136/249; 136/258; 136/260; 29/572; 427/74; 357/30
[58] Field of Search ............... 29/572; 136/258 PC, 136/260, 250, 249 TJ; 427/74; 357/30

[56] References Cited

U.S. PATENT DOCUMENTS 4,251,286 2/1981 Barnett ............................ 136/260
4,471,036 9/1984 Skotheim ........................ 429/111

FOREIGN PATENT DOCUMENTS 54-17274 6/1979 Japan ........................ 136/258 PC Primary Examiner—Aaron Weisstuch
Attorney, Agent, or Firm—Cushman, Darby & Cushman

[57] ABSTRACT

A method to prevent short-circuits or shunts in a large area thin film solar cell comprises applying, to a substrate with a first conductive electrical contact, at least one first layer comprising a p-type or n-type conductive layer and a second layer comprising an n-type or p-type conductive layer or a Schottky barrier layer. The second layer, in turn, is provided with a second conductive electrical contact. Those areas of the first conductive electrical contact which are effectively uncovered by the first layer are passivated after forming the first layer and before application of the second layer.

12 Claims, 2 Drawing Figures

METHOD FOR PREVENTING SHORT-CIRCUITS OR SHUNTS IN A LARGE AREA THIN FILM SOLAR CELL AND CELL OBTAINED THEREBY

BACKGROUND AND SUMMARY OF THE INVENTION

The present invention relates to a method for preventing short-circuits or shunts in a large area thin film solar cell, comprising a substrate with a conductive electrical (first) contact, on which one applies at least one first p- or n-conducting layer and a second n- or p-conducting layer, which may be replaced by a Schottky blocking layer, which for its part is provided with a conductive electrical (second) contact, preferably a grid.

Solar cells having a diode-like structure can be composed of crystalline or amorphous substances. As an example, the reader's attention is directed to U.S. Pat. No. 4,064,521 or the European Patent Specification No. 715, where thin film solar cells are described as being made of amorphous silicon or, respectively, cadmium sulfide-copper sulfide. Basically, thin film solar cells consist of a substrate, on which a first (back wall) metallic contact is applied, on which in turn there are applied at least one p- or n-conductive thin layer and on that layer a second p- or n-conductive thin layer. The top layer is then provided with a second conductive electrical contact, which can be a metal grid or a transparent conductive layer. Finally, the second electrical contact is covered e.g. by a cover glass. As an alternative, a thin film solar cell can have a Schottky blocking layer, which then is disposed between the second conductive electrical contact as a front contact and an n- or p-conductor layer. In order to economically produce and use large area solar cells, it is necessary that the solar cells do not have any short circuits or shunts which can develop during manufacture. The cause for these shorts and shunts is that the first thin p- or n-conductive film applied on the first electrical contact can have inhomogeneities, by which a conductive junction between the back wall (first) and the front wall (second) electrical contact is effected, or on the other hand an imperfect blocking layer is formed impeding the diode effect.

The inhomogeneities can occur in various ways. When evaporating the layers, especially the first semiconductor layer, dust particles on the substrate could cause holes. These particles will shadow off the first electrical contact and thus prevent formation of the thin layer during the evaporation process. This interference in formation will result in holes in the otherwise continuous layer. Further, the kinetics of forming thin layers show that due to the process of cluster formation during the development of the first mono-layers, there will always appear holes, so-called pin-holes or needle-holes, at individual locations. Further inhomogeneities resulting in shorts or shunts can then develop when the thin layers are etched, since at accumulations of grain boundaries the etching effect is more pronounced, which likewise can cause the formation of holes. The above-described inhomogeneities, especially defined by pin-holes, lead to the fact that the internal field which must form between p- and n- conductors is not realized at these locations, whereby a shunt is caused at the location of the pin-hole to the otherwise developed pn-junction.

In U.S. Pat. No. 4,166,918 and German Offenlegungschrift No. 32 23 432, a method is described for eliminating short circuits or shunts in solar cells. This is effected by connecting a finished solar cell to a reverse voltage and the solar cell is dipped into an electrolyte. Consequently, the elimination of such shorts or shunts takes place only after the completion of the solar cell. Such procedure thus follows the course taken in the laboratory scale production of solar cells, i.e. to test the performance capacity of a solar cell and correct existing defects only after the solar cell has been finished. This checking or, correcting, is considered rather expensive, especially in large scale production, since naturally not as many inhomogeneities as will cause failures can be remedied. In other words, even by using the method known from the prior art, it can happen that a particular solar cell will not yield the required performance.

It is therefore the object of the present invention to improve the above mentioned method in such a manner as to guarantee in a large scale production of large area thin film solar cells before they are finished, that existing inhomogeneities will not cause any failures in the finished solar cell. According to the invention the problem is solved in that, after application of the first layer and before application of the second layer, those areas of the first conductive electrical contact that are not effectively covered by the first layer, will be passivated. Thus by the teaching of the present invention one is departing from the procedure established by the prior art, that is to examine the solar cell after it has been finished, for eventual defects and to remedy them if necessary. Thus prior to completion of the solar cell a determination is made whether a solar cell is functioning satisfactorily or not; it should be taken into account that an unlimited number of inhomogeneities can not be remedied. According to the invention, however, this can be determined immediately after application of the first layer.

The passivation of the local inhomogeneities can take place in such a manner that the exposed area of the first conductive electrical contact, which is preferably configured as a metal layer, is converted into a semiconductor of the same type as the first layer, or as compared to the first layer, into a layer of higher resistance, e.g. an insulator. Thus, short circuits or shunts can be eliminated by the formation of planar layers.

In addition, special attention should be given to the possibility of depositing a thin metal layer in the exposed areas, which layer is converted into a semiconductor of the same type as the first layer, or as compared to the first layer, into a layer of higher resistance. Especially in the fabrication of a thin film solar cell in which the conductive electrical contact is silver, the first layer is an n-type cadmium sulfide layer, and the second layer preferably a p-type copper sulfide layer, inhomogeneities can be remedied in such a manner that the silver not effectively covered by the cadmium sulfide layer is converted into silver sulfide, or a metal such as e.g. aluminum, which is deposited on the silver and preferably oxidized or sulfided.

In the case of a thin film solar cell, where the first conductive electrical contact is Au, the first layer is a p-type semiconductor such as $Cu_2S$ and the second layer preferably n-type CdS, the passivation can be effected in such a manner that the gold not effectively covered by the p-type semiconductive layer is converted into a halogenide or chalcogenide, or that a metal like e.g. Cu is deposited on the gold, which subsequently will be oxidized or converted to a chalcogenide.

The method according to the invention must be considered as especially advantageous in connection with the fabrication of tandem-solar cell systems, where solar cells of different spectral sensitivity are arranged one on top of the other. Such tandem-solar cell systems cannot be effectively passivated by the known method for eliminating shorts or shunts. The teachings according to the invention offers for the first time a possibility of guaranteeing, even in large scale manufacture of such tandem-solar cell systems, that the systems in field deployment are functioning efficiently.

BRIEF DESCRIPTION OF THE ACCOMPANYING DRAWING

Other details, advantages and characteristics of the invention will become more apparent by means of the attached drawings, wherein:

FIG. 1 shows a thin film solar cell, and
FIG. 2 shows a tandem-solar cell system.

DETAILED DESCRIPTION OF THE PREFERRED EXEMPLARY EMBODIMENTS

Figure 1:
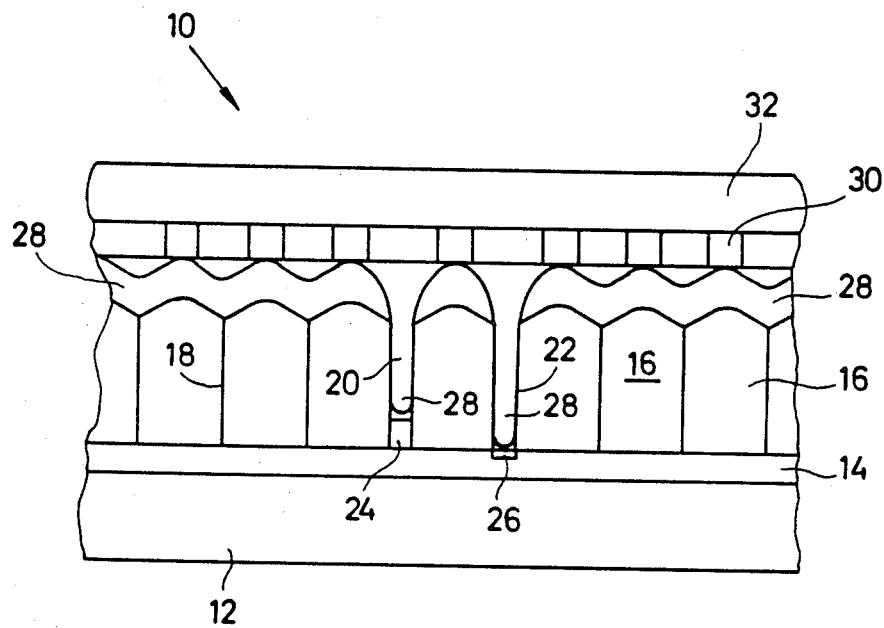

The realization of the method for preventing short circuits or shunts in solar cells fabricated in large-scale production shall be described by means of a $CdS/Cu_2S$ solar cell illustrated as an example in FIG. 1. Referring to such a solar cell 10, at first a layer of silver 14 is applied by evaporating on a base plate, preferably a glass substrate 12, which has been previously provided with an adhesive agent such as e.g. evaporated chromium. On this metal layer 14 defining an electrical contact a layer of cadmium sulfide 16 of a thickness of e.g. 30 $\mu$m is applied by e.g. sintering, pyrolytic decomposition, or evaporation. Depending on the manufacturing process, the thus formed cadmium sulfide layer 16 can thereafter be etched by a wet process or a dry plasma process, in order to etch off e.g. accumulations of grain boundaries 18 and to reduce the reflection of the layer.

However, it is common to all deposition methods that in the cadmium sulfide layer 16 inhomogeneities will appear, usually formed like pin-holes 20, 22, which indeed can be microscopically small but nevertheless are present. In order to make the inhomogeneities ineffective, after application of the cadmium sulfide layer 16, the back wall metallic contact 14, which in the areas of the pin-holes 20, 22 is not covered by the semiconductor layer 16, preferably will be removed at the locations of the pin-holes by suitable etchants, e.g. by immersion in nitric acid, or dipped in solutions containing S-ions so that the surface of the metallic layer 14, made of silver for example, is converted into a layer of n-conductive $Ag_2S$ (e.g. by immersion in $(NH_4)_2S$-solution) of preferably about 0.1 to 1 $\mu$m thickness, or treated in a $H_2S$-atmosphere, whereby the silver is likewise converted into $Ag_2S$, or treated plasma-chemically in an atmosphere containing S-ions such that the silver is converted into a $Ag_2S$ layer of preferably 0.1 to 1 $\mu$m thickness, or treated by means of galvanic deposition of aluminum in the pin-holes from e.g. an aluminum chloride, aluminum acetate, or aluminum sulfate solution, where the deposited aluminum layer preferably has a thickness of approximately 0.1 to 1 $\mu$m. Subsequently, the aluminum is converted into $Al_2O_3$ by anodically oxidizing, so that the metal layer 14 is covered with an insulating layer. The thickness of the $Al_2O_3$ layer preferably can be made about 1 $\mu$m by choosing the voltage applied during the anode oxidation process.

As soon as the inhomogeneities have been remedied in the manner described above as an example, a p-type semiconductive copper sulfide layer 28 is grown by a topotactic process, i.e. the cadmium sulfide layer 16 is immersed in a solution containing copper ions, whereby the surface of the cadmium sulfide layer 16 is converted into copper sulfide layer 28. The copper sulfide layer 28 can have a thickness on the order of e.g. 0.2 $\mu$m. A copper layer 30 which can be in the form of a grid structure is applied on the copper sulfide layer 28 as a front wall metallic contact. Subsequently the solar cell is covered with a transparent encapsulating layer 32. These thin film solar cells 10, which according to the teachings of the invention can be made in large scale production, show a high quality, guaranteeing operation with little need of attention.

Figure 2:
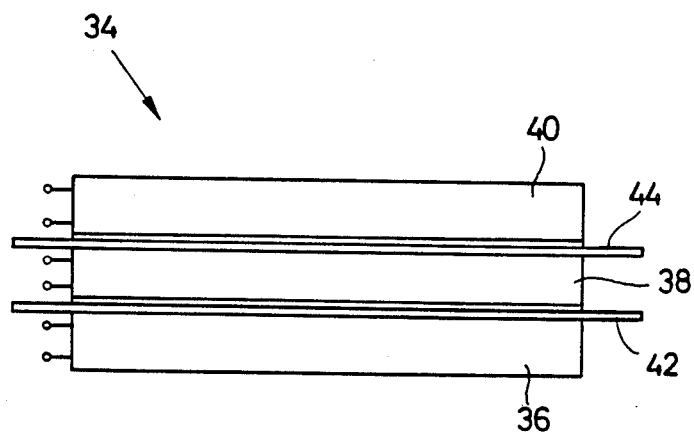

The method according to the invention can also be used for a tandem-solar cell system 34 (FIG. 2). Such a tandem-solar cell system 34 is composed of solar cells 36, 38, 40 being arranged one upon the other, which may be electrically separated from each other by intermediate layers 42 and 44. The embodiment example shows the tandem-solar system 34 with only three solar cells of different spectral sensitivity; however, one can of course stack more solar cells to form a desired system. By using the method according to the invention in the fabrication of the individual solar cells which are components of the system, there is the obvious advantage of a rather high guarantee of perfect performance of the system, since each solar cell can be passivated in a simple but also reliable manner, so that short circuits or shunts are eliminated.

The method according to the invention as described in the foregoing in conjunction with a thin film solar cell or, respectively, a tandem-solar cell system can, of course, likewise be applied to solar cells where, with respect to manufacturing technique, a first front wall (on the side of the light source) transparent conductive layer is formed, e.g. $SnO_x$ or ITO.

Further, as an example, np-type solar cells should be mentioned, which on application of the method according to the invention, show reliable performance with little need of attention. This includes solar cells such as $CdS/CdTe$, $CdS/InP$, $CdS/CuInSe_2$, $CdS/CuInS_2$, $CdS/ZnTe$, and $CdS/Cu_2S$. Further, one can also use ternary systems, such as, e.g. $Cd_{1-x}Zn_xS$.

Finally, special attention is called once more to the essential advantages that can be attributed to the method according to the invention:

(a) large-scale fabrication of thin film solar cells of high quality, (b) high quality guaranteed by elimination of short circuits and/or shunts, (c) an extremely simple but nevertheless reliable method, (d) no significant increase of cost in the fabrication of thin film solar cells.

While reference has been herein made to what is presently believed to be the most preferred exemplary embodiments of the present invention, those in this art may recognize that many modifications may be made thereto, which modifications shall be accorded the broadest scope of the appended claims so as to encompass all equivalent methods and processes.

I claim:

1. A method for preventing short-circuits or shunts in a large area thin film solar cell, said method comprising the steps of sequentially applying, to a substrate comprising a first conductive electrical contact, (a) at least one first layer comprising a p-type or n-type conductive layer, and (b) a second layer comprising an n-type or p-type conductive layer or a Schottky barrier layer, said second layer also being provided with a second conductive electrical contact wherein, after forming the first layer and before application of the second layer, there is practiced the step of passivating those areas of the first conductive electrical contact which are effectively uncovered by the first layer.

2. A method according to claim 1, wherein the step of passivating the uncovered areas is practiced by converting the uncovered areas into a semiconductor of the same conductivity type as the first layer or, as compared to the first layer, into a layer of higher resistance, or into an insulator.

3. A method according to claim 1, wherein the step of passivating the uncovered areas is practiced by depositing a metal layer in the uncovered areas, which metal layer is then converted into a semiconductor of the same conductivity type as the first layer, or as compared to the first layer, into a layer of higher resistance, or into an insulator.

4. A method according to claim 1 wherein the first conductive electrical contact is silver, the first layer is an n-type cadmium sulfide layer, and the second layer is a p-type copper sulfide layer, and wherein the step of passivating the areas of the silver layer effectively uncovered by the cadmium sulfide layer is practiced by converting the uncovered areas of the silver layer into silver sulfide.

5. A method according to claim 4 wherein the step of passivating the areas of the silver layer effectively uncovered by the cadmium sulfide layer is practiced by depositing a metal layer onto the silver layer and then oxidizing or sulfidizing the metal layer.

6. A method according to claim 5, wherein the metal layer is aluminum.

7. A method according to claim 1 wherein the first conductive electrical contact is gold, the first layer is a p-type $Cu_2S$ layer and the second layer is an n-type CdS layer, and wherein the step of passivating the areas of the gold layer effectively uncovered by the $Cu_2S$ layer is practiced by converting the uncovered areas of the gold layer into a halogenide or chalcogenide.

8. A method according to claim 7, wherein the step of passivating the areas of the gold layer effectively uncovered by the $Cu_2S$ layer is practiced by depositing a metal onto the gold layer and then oxidizing the metal layer.

9. A method according to claim 7, wherein the step of passivating the areas of the gold layer effectively uncovered by the $Cu_2S$ layer is practiced by depositing a metal layer onto the gold layer and then converting the metal layer into chalcogenide.

10. A method according to claim 9, wherein the metal layer is copper.

11. A solar cell made according to the method of claim 1.

12. A tandem-solar cell system including a plurality of solar cells each made according to the method of claim 1.

* * * * *